(12) United States Patent
Hurbi et al.

(10) Patent No.: US 10,181,433 B2
(45) Date of Patent: Jan. 15, 2019

(54) APPARATUS AND METHOD OF TUNABLE HEAT SINK

(71) Applicant: MICROSOFT TECHNOLOGY LICENSING, LLC, Redmond, WA (US)

(72) Inventors: Erin Elizabeth Hurbi, San Francisco, CA (US); Michael Nikkhoo, Saratoga, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 15/456,440

(22) Filed: Mar. 10, 2017

(65) Prior Publication Data

US 2018/0261521 A1    Sep. 13, 2018

(51) Int. Cl.
*H01L 23/367* (2006.01)
*H01L 23/433* (2006.01)

(52) U.S. Cl.
CPC ........ *H01L 23/3675* (2013.01); *H01L 23/433* (2013.01)

(58) Field of Classification Search
CPC .......................... H01L 23/3675; H01L 23/433
See application file for complete search history.

(56) References Cited

U.S. PATENT DOCUMENTS

| | | |
|---|---|---|
| 5,623,394 A | 4/1997 | Sherif et al. |
| 5,796,582 A | 8/1998 | Katchmar |
| 5,838,016 A | 11/1998 | Johnson |
| 6,026,888 A | 2/2000 | Moore |
| 6,330,157 B1 | 12/2001 | Bezama et al. |
| 7,180,745 B2 * | 2/2007 | Mandel ............... H01L 21/4878 257/706 |
| 8,776,870 B2 | 7/2014 | Chang et al. |
| 2002/0084524 A1 * | 7/2002 | Roh .................... H01L 23/3128 257/738 |
| 2003/0164549 A1 * | 9/2003 | Nakayama .......... H01L 23/3128 257/777 |

(Continued)

FOREIGN PATENT DOCUMENTS

| | | |
|---|---|---|
| KR | 101553697 B1 | 9/2015 |
| WO | 2013159075 A1 | 10/2013 |

OTHER PUBLICATIONS

C-Therm Technologies, "Thermal Resistance & Thermal Conductance", Jul. 2012.*

(Continued)

*Primary Examiner* — Kyoung Lee
*Assistant Examiner* — Christina Sylvia
(74) *Attorney, Agent, or Firm* — NovoTechIP International PLLC

(57) ABSTRACT

A first surface of a heat source is spaced from a support by a first gap, in a thermal path from the first surface to the support. A second surface of the heat source, opposite to the first surface, is spaced by a second gap from a heat sink, in a thermal path from the second surface to the heat sink. The thermal path to the support provides a first thermal resistance, based on a gap spacing of the first gap and the thermal path to the heat sink provides a second thermal resistance, based on a gap spacing of the second gap.

17 Claims, 6 Drawing Sheets

(56) References Cited

U.S. PATENT DOCUMENTS

| | | |
|---|---|---|
| 2003/0178719 A1* | 9/2003 | Combs ................ H01L 23/3128 257/704 |
| 2004/0238121 A1* | 12/2004 | Masumura .............. B24B 37/30 156/345.12 |
| 2004/0250996 A1 | 12/2004 | Yi et al. |
| 2006/0065974 A1* | 3/2006 | Kumaus ................ H01L 23/053 257/720 |
| 2008/0079129 A1 | 4/2008 | Ganapathysubramanian et al. |
| 2008/0178920 A1 | 7/2008 | Ullo |
| 2013/0327505 A1 | 12/2013 | Gonzalez et al. |
| 2014/0146480 A1 | 5/2014 | Ullo et al. |
| 2015/0098176 A1 | 4/2015 | Dean et al. |

OTHER PUBLICATIONS

Yoon, et al., "Surface roughness effects on the frequency tuning performance of a nanoelectromechanical resonator", In Journal of Nanoscale Research Letters, vol. 8, Issue 1, Jun. 7, 2013, pp. 1-6.

* cited by examiner

APPARATUS AND METHOD OF TUNABLE HEAT SINK

TECHNICAL FIELD

This disclosure relates generally methods and devices for carrying heat from device sources and, more particularly, to providing heat paths with tunable thermal resistivity.

BACKGROUND

Various wearable electronic devices, such as wearable gaming controllers can include integrated circuit (IC) chips that can generate substantial heat. Such wearable devices can also have exterior surfaces that, by design or through incidence of use, make contact with the user's skin, both direct and through non-protective apparel. Various techniques for carrying heat from the ICs in such devices have been employed. These include, for example, heat spreaders, heat pipes, and finned heat sinks, sometimes in combination with air flow, from a passive vent or assisted by air blowers. There are various techniques for employing certain of these to wearable electronic devices.

There are technical problems that remain, though, which can be of particular concern in the field of wearable electronic devices. One such technical problem is the routing of heat from the heat sources, with usable and practical ability of both meeting surface temperature profile desires or limits, and sufficiently removing heat from the ICs to avoid thermal damage. Also, to be practical and usable, such technical solution must also meet weight, size, noise and cost constraints particular to wearable electronic devices.

This technical problem has significant aspects, and these can both illustrate the need for, and difficulties of a solution. One of the aspects is that due to application-specific design constraints and performance goals, heat generating ICs may be positioned at a sub-optimal spacing—with respect to heat—from an exterior surface that is designated, or likely, to be in contact with a user's skin. Overlapping somewhat with this aspect is the common design objective, to use the same or similar ICs in a variety of different types, shapes and configurations of wearable electronic devices, constructed with different housing materials.

Disclosed methods and apparatuses, described in greater detail in paragraphs that follow and the referenced drawings, provide technical solutions to the above-described technical problems, and provide further technical benefits and advantages.

SUMMARY

Apparatuses and methods for a tunable, multi-path carrying heat from a heat source are disclosed. Disclosed methods include supporting a heat source, on or by a support member, and alternatively arranging a heart source in a configuration with a support member, and providing a first thermal path from a heat source first surface through a first gap to the support member; and providing a second thermal path from a heat source second surface through a second gap to a heat sink. The first thermal path can provide a first thermal resistance that can be based on a gap spacing of the first gap. The second path can provide a second thermal resistance, based on a gap spacing of the second gap. The heat source first surface can face opposite the heat source second surface. The first thermal resistance can be additionally or alternatively set by applying a given surface textures to the first gap. The second thermal resistance can be additionally or alternatively set by set by applying a given surface texture to the second gap.

Disclosed apparatuses can include a support member; a heat source placed on the support member; a first support spacer that can be coupled to a support surface of the support member and can extend to a heat source first surface, and can be configured to space the heat source first surface a first gap spacing above the support surface. Apparatuses can include a heat sink that can be supported on the support surface by second support spacers to extend a heat sink face over and spaced, by a second gap spacing, from a heat source second surface. Disclosed apparatuses can include the first gap spacing being configured to enable a first thermal path, from the heat source first surface to the support member, the second gap spacing being configured to enable a second thermal path, from the heat source second surface to the heat sink. The first thermal path can provide a first thermal resistance that is based on the first gap spacing, the second thermal path can provide a second thermal resistance that is based on the second gap spacing, and the heat source first surface can face opposite the heat source second surface.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

Figure 1:
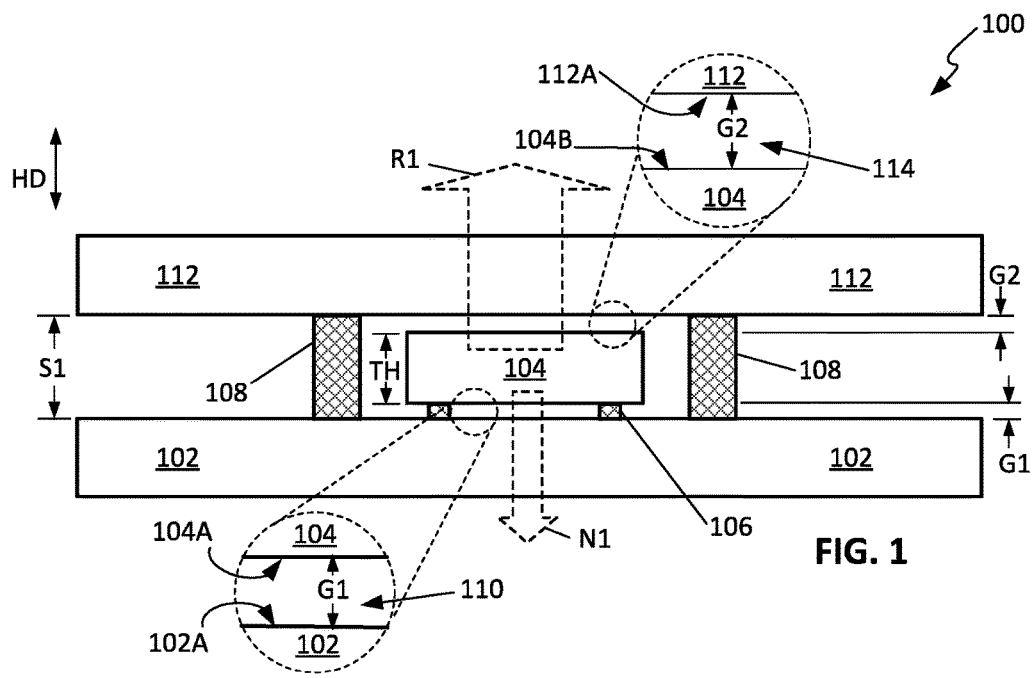
FIG. 1 illustrates a cross-sectional view of an example implementation of one tunable multi-path heat sink apparatus in accordance with one or more aspects of the present application.

In the following detailed description, numerous specific details are set forth by way of examples in order to provide a thorough understanding of the disclosed subject matter. It will be apparent to persons of ordinary skill, upon reading this description, that various aspects can be practiced without such details.

For purposes of this disclosure, the term "heat sink" encompasses, without limitation, any structure or a combination of structure(s) configured to provide a thermally conductive path, from a source to any heat receiving structure or combination of structure(s), and/or configured to radiate the received heat as electromagnetic energy, into a medium or into a vacuum, or through a medium or vacuum toward any heat radiation receiving structure, and/or configured to transfer the received heat by convention to any ambient air or other gas or mixture of gasses.

Implementations provide tunable apportioned thermal resistance, multi-path heat sinks, that can include a first thermal path, from a first surface area of a heat source to a support, and a second thermal path from a second surface area of the heat source to a heat sink. An example first surface area can be a lower or bottom surface of the heat source, and an example second surface area can be an upper or top surface of the heat source. The first thermal path can include a first gap having a first gap spacing, and the second thermal path can include a second gap having a second gap spacing. Various implementations provide a setting of the first gap spacing, or the second gap spacing, or both, to set desired thermal resistance of the first thermal path, desired thermal resistance of the second thermal path, and desired ratio and apportionment thereof. The heat source can be an IC package, a housing for multiple IC packages, or any other heat-generating device or apparatus. The support can be, for example, an external housing, a substrate, or a printed circuit board. The support can be, and can include a heat sink.

As will be understood by persons of skill upon reading this disclosure, benefits and advantages provided by such implementations can include, but are not limited to, a solution to the technical problem of needing multiple redesigns of heat sinks to obtain different heat flows, as well as needing multiple redesigns of heat sinks to obtain respectively different apportionments of heat flows to each of multiple thermal paths from a heat source. Implementations include, in place of one or both of the first gap and second gap, one or more interfaces coupling opposing surfaces. The interfaces can include fused or bonded interfaces.

Implementations can include forming or applying a specific surface texture to surfaces forming the first gap, the second gap, or both. Implementations can also include forming or applying a specific surface texture to opposing surfaces forming one or more interfaces, or that face gaps. For purposes of this description, "surface texture" means a two-element value, with one element being material type and the other element being surface finish or topography measured, for example, by surface roughness, waviness and lay, as these metrics are defined, for example, by American Society of Mechanical Engineers (ASME) B46.1 2009, hereinafter "ASME B56.1," and all sections therefore that define surface roughness, waviness and lay are hereby incorporated by reference.

FIG. 1 illustrates a cross-sectional view of an example implementation of one tunable multi-path heat sink apparatus in accordance with one or more aspects of the present application. Description of exemplary features and aspects will reference implementations as "tunable multi-path heat sink apparatus 100." The tunable multi-path heat sink apparatus 100 can include a support 102 and a heat source 104 that can be spaced from a top or support surface 102A of the support 102 by spacers 106. For purposes of description, the spacers 106 will be alternatively referred to as "heat source support spacers 106." Example implementations can include the heat source support spacers 106 being mechanically attached to or secured to the top surface 102A of the support 102 and to the bottom surface of the heat source 104, such that the spacers 106 both support and secure the heat source 104. Other example implementations include other support (not visible in FIG. 1) for the heat source 104, configured to hold the heat source 104, or the support 102, or both in an arrangement where the heat source 104 is spaced from the support by a gap, maintained for example by heat source support spacers 106.

Referring again to FIG. 1, the support 102 can include, for example, a housing, or a structure mounted or otherwise coupled to a housing. In an implementation, the support 102 can be or can include a heat sink. Implementations of the heat source 104 can include, for example, a canister or other housing that can surround one or more heat generating devices, such as IC chips, batteries, power supplies, and so forth. Implementations described in greater detail later in this disclosure can use, for example, as a support 102, a ceramic or other substrate, or a printed circuit board (PCB). In such implementations, the heat source 104 can be, or can include, for example, an IC circuit (not separately visible in FIG. 1) or a packaged IC circuit.

In an aspect, the heat source 104 can have a surface 104A that can be proximal to and spaced by a gap 110 from the support surface 102A of the support 102. For purposes of description, the surface 104A will be alternatively referred to as the "heat source first surface 104A." Also, for convenience in referring description of the heat source first surface 104A to the image plane of FIG. 1, the heat source first surface 104A will be interchangeably referred to as the "heat source lower surface 104A." A surface 104B of the heat source is spaced by a heat source thickness TH in the height direction HD above the heat source first or bottom surface 104A. For purposes of description, the surface 104B will be alternatively referred to as the "heat source second surface 104B." For convenience in referring description of the heat source second surface 104B to the image plane of FIG. 1, that surface will be interchangeably referred to as the "heat source upper surface 104B."

Referring again to FIG. 1, the gap 110 can have a gap spacing, such as the spacing labeled in FIG. 1 as "G1." For purposes of description, the gap 110 will be alternatively referred to as "first gap 110" and the gap spacing G1 will be alternatively referred to as "first gap 110 spacing G1." As illustrated in FIG. 1, the G1 value can be established by a height (visible but not separately labeled) of the heat source support spacers 106. For purposes of this description "height," in the context of the heat source support spacers 106, includes a direction that is normal to and directed away from an extending plane of the support 102, such as the example direction axis HD appearing on FIG. 1.

The tunable multi-path heat sink apparatus 100 can include one or more heat sink support spacers 108, each having a base or first end (visible but not separately labeled) that can be coupled to the support 102. The meaning of "coupled," as used in this disclosure in the context of a mechanical state, includes but is not limited to attached, adhered, bonded, secured, connected, formed upon, or supported by, or any combination or sub-combination thereof, whether direct or indirect. In an implementation, each of the heat sink support spacers 108 can extend in the direction HD, to a distal or second end (visible but not separately labeled) that can be a distance or height, labeled "S1" in FIG. 1, above the support surface 102A of the support 102. For purposes of description, the distal or second end of the heat sink support spacers 108 will be alternatively referred to as "heat sink support spacer 108 tops."

Referring again to FIG. 1, a heat sink 112 can be supported on or at, or otherwise coupled to the heat sink support spacer 108 tops, in configuration where a first surface 112A of the heat sink 112 faces toward the support surface 102A and extends in a plane (visible in cross section in FIG. 1 but not separately labeled) that is the height S1 above the support surface 102A. The height S1 can be selected, in view of a thickness TH of the heat source 104 and the height of the heat source support spacers 106, to provide a gap 114 between the first surface 112A of the heat sink 112 and the upper surface 1046 of the heat source 104, and to provide the gap 114 with a desired gap spacing G2. For purposes of description, the gap 114 can be alternatively referred to as "second gap 114," and the gap spacing G2 will be alternatively referred to as "second gap 114 spacing G2." The second gap 114 spacing G2 is illustrated in FIG. 1 as substantially uniform, but it will be understood that this is not intended as a limitation.

The appended figures graphically represent thermal paths as directed arrows, and graphically represent change in thermal resistance of a given thermal path by an inversely proportional change in the diameter of the directed arrow and a change to the label of the directed arrow. For example, referring again to FIG. 1, a first thermal path is represented by the downward (relative to the image plane of FIG. 1) directed arrow labeled "N1," and a second thermal path is represented by the upward (relative to the image plane of FIG. 1) directed arrow labeled "R1." The first thermal path, in the FIG. 1 example, includes from the heat source 104, through the bottom surface 104A of the heat source 104, through the first gap 110, and into the support 102. The second thermal path, in the FIG. 1 example, includes from the heat source 104, through the upper surface 1046 of the heat source 104, through the second gap 114, and into the heat sink 112.

The illustrated structure provides the first thermal path N1 with a thermal resistance that is established, in part, by the first gap 110 spacing G1, and provides the second thermal path R1 with a thermal resistance that is established, in part, by the second gap 110 spacing G2. For purposes of description, the thermal resistance of the first heat transfer path N1 will be referred to as the "first transfer path thermal resistance," and the thermal resistance of the second heat transfer path R1 will be referred to as the "second transfer path thermal resistance."

Figure 2:
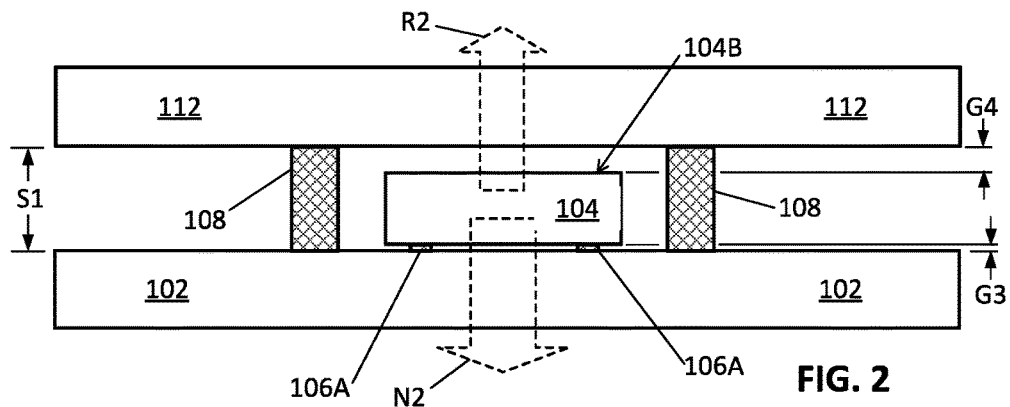
FIG. 2 illustrates an exemplary gap spacing that provides a setting of thermal resistances in accordance with one or more aspects of the present application.

FIG. 2 illustrates an exemplary gap spacing and a providing of a setting of thermal resistances in accordance with one or more aspects of the present application. The particular example shown in FIG. 2, as will be described in greater detail, decreases the first transfer path thermal resistance and increases the second transfer path thermal resistance. These changes are represented in FIG. 2 by the first thermal path N1 becoming first thermal path N2 and the second thermal path R1 becoming the second thermal path R2. The decreased thermal resistance obtained by N2 is represented by its arrow being wider than the FIG. 1 arrow representing N1. The increased thermal resistance obtained by R2 is represented by its arrow being narrower than the FIG. 1 arrow representing R1.

It will be understood that in the appended figures the comparative width of arrows representing first thermal paths and arrows representing second thermal paths are not intended to imply or indicate any comparative values of the first path thermal resistance in relation to the second path thermal resistance. For example, referring to FIG. 1, the arrow representing the first thermal path N1 is smaller than the arrow representing the second thermal path R1. This is not intended to imply that the first path thermal resistance is necessarily greater than, less than, or equal to the second path thermal resistance.

Referring again to FIG. 2, the illustrated implementation includes changing the height of the heat source support spacers 106, to a height such as illustrated by the modified height heat source support spacers 106A, while holding the height of the heat sink support spacers 108 constant. As will be seen, this provides concurrent, but opposite, change in the first path thermal resistance and the second path thermal resistance. For convenience, the FIG. 2 example is illustrated and described as an adaptation of the FIG. 1 example tunable multi-path heat sink apparatus 100. It will be understood that this is not intended as a limitation on the scope implementations and practices in accordance with this disclosure and its appended claims.

Referring again to FIG. 2, an example can include reducing the height of the heat source support spacers 106 to that of the modified heat source support spacers 106A, by an amount that will be arbitrarily referred to as "Delta1." The result, as illustrated in FIG. 2, is a reduction in the first gap spacing, from G1 to G3, and increase in the second gap spacing, from G2 to G4. Obtained effects include a concurrent change in the second heat transfer path, from R1 to R2, in a manner that decreases the first path thermal resistance and increases the second path thermal resistance. As described above, these changes are represented in FIGS. 1 and 2 by the first thermal path N1 becoming first thermal path N2 and the second thermal path R1 becoming the second thermal path R2, the FIG. 2 arrow representing first thermal path N2 being wider than the FIG. 1 arrow representing N1, and the FIG. 2 arrow representing R2 being narrower than the FIG. 1 arrow representing R1.

Regarding the specific values of G3 and G4, these can be application-specific and can be readily determined by persons of ordinary skill, upon reading the present disclosure. Therefore, further detailed description of G3 and G4 values is omitted.

Figure 3:
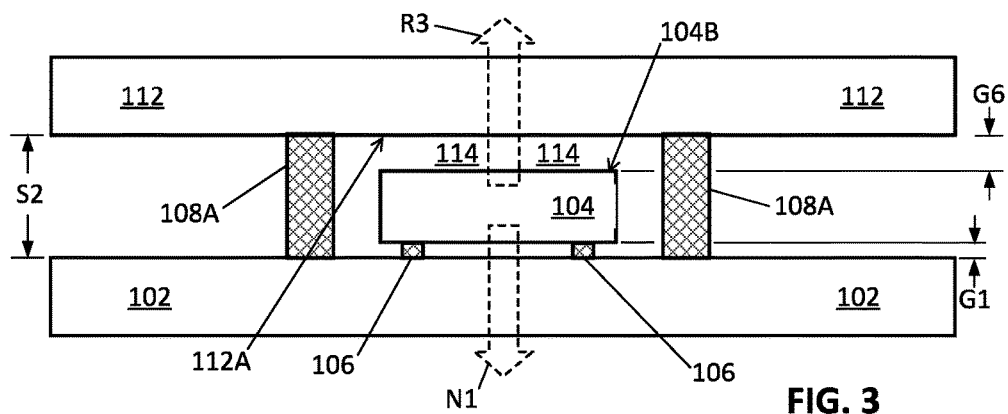
FIG. 3 illustrates another exemplary gap spacing that provides a setting of thermal resistances in accordance with one or more aspects of the present application.

FIG. 3 illustrates another exemplary gap spacing and a providing of a setting of thermal resistances in accordance with one or more aspects of the present application. The illustrated implementation shown in FIG. 3 changes the height of the heat sink support spacers 108, without changing the height of the heat source support spacers 106. For convenience, the FIG. 3 example is illustrated and described as an adaptation of the FIG. 1 example tunable multi-path heat sink apparatus 100. It will be understood that this is not intended as a limitation on the scope implementations and practices in accordance with this disclosure and its appended claims.

The specific change that is illustrated in FIG. 3 is an increase in the height of the heat sink support spacers 108, assuming the FIG. 1 heights as the starting point, by an amount that will be arbitrarily referred to as "Delta2." FIG. 3 labels the increased height heat sink support spacers 108 as "108A." The results, as illustrated in FIG. 3, are an increase in the height of the heat sink 112 to S2 above the support surface 102A of the support 102, and corresponding increase of the second gap 114 spacing, from the FIG. 1 second gap 114 spacing from G2 to G6, with no change in the first gap spacing G1. The technical effects include a change in the second heat transfer path, from R1 to R3, in a manner that increases the second path thermal resistance, with no change in the first path thermal resistance. This is illustrated in FIG. 3 by the diameter of the arrow representing the changed second thermal path R3 being smaller than the diameter of the FIG. 1 arrow representing the original second thermal path R1, with the diameter of the arrow representing the first thermal path N1 being unchanged.

Regarding the specific value of Delta2 and, and therefore G6, these can be application-specific and can be readily determined by persons of ordinary skill, upon reading the present disclosure, and therefore further detailed description of G6 values is omitted.

Features illustrated by FIGS. 2 and 3 can be combined, namely by applying respective increases or decreases to the heat source support spacers 106 or the heat sink support spacers 108, or both, to obtain desired changes in one or both of the first path thermal resistance and second path thermal resistance. For example, the height of the heat source support spacers 106 can be reduced, in combination with reducing the height of the heat sink support spacers 108, to obtain a decrease in the first gap 110 spacing with no change in the second gap 114 spacing. In another example, the height of the heat source support spacers 106 can be reduced, in combination with reducing the height of the heat sink support spacers 108 sufficiently to obtain both a decrease in the first gap 110 spacing and a decrease in the second gap 114 spacing.

In an aspect, implementations as illustrated by FIGS. 2 and 3 can be applied as stand-alone features, to obtain the described technical effects of changing the first path thermal resistance, or the second path thermal resistance, or both. Another implementation can include applying a given or selected surface texture to the above-described surfaces forming the first gap 110, or the surfaces forming the second gap 114, or both. For purposes of describing aspects and examples of these implementations, the terms "first gap 110 surface texture" and "second gap 114 surface texture" are hereby introduced. The term "first gap 110 surface texture" is defined as a surface texture on the support surface 102A, or a surface texture on the lower surface 104A of the heat source 104, or both, in the regions they face another to form the first gap 110. The term "second gap 114 surface texture" is defined as a surface texture on the upper support 104A of the heat source 104, or a surface texture on a lower surface 112A of the heat sink 112, or both, in the regions they face another to form the second gap 114.

Figure 4A:
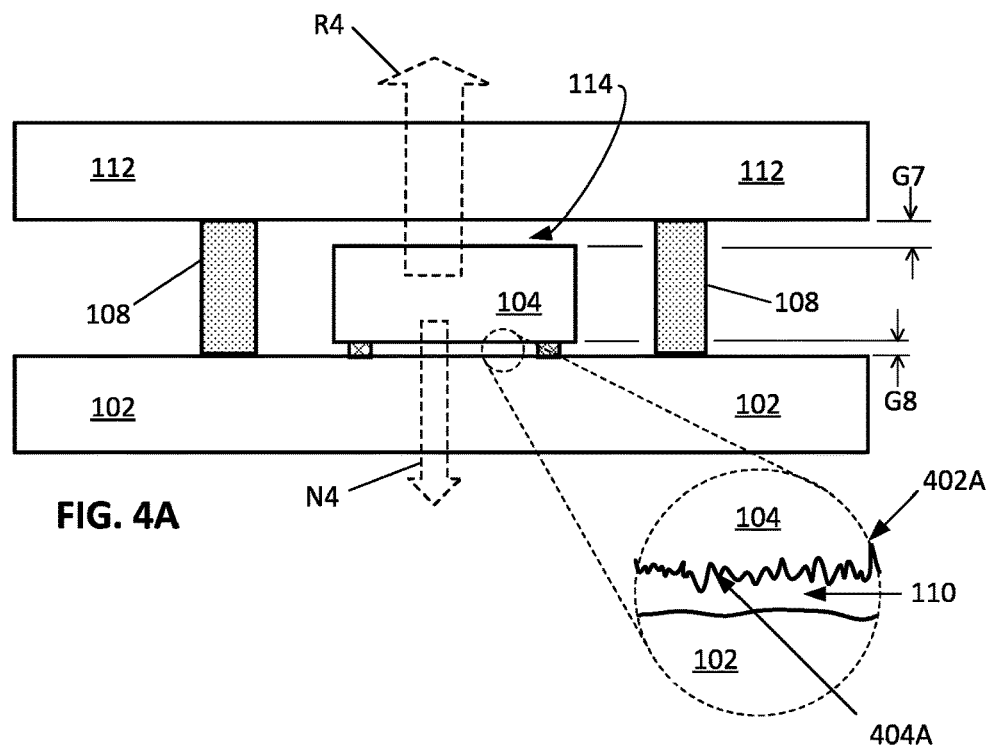
FIGS. 4A and 4B illustrate an example gap surface texture and a providing of additional or alternative setting of path thermal resistance in accordance with one or more aspects of the present application.
Figure 4B:
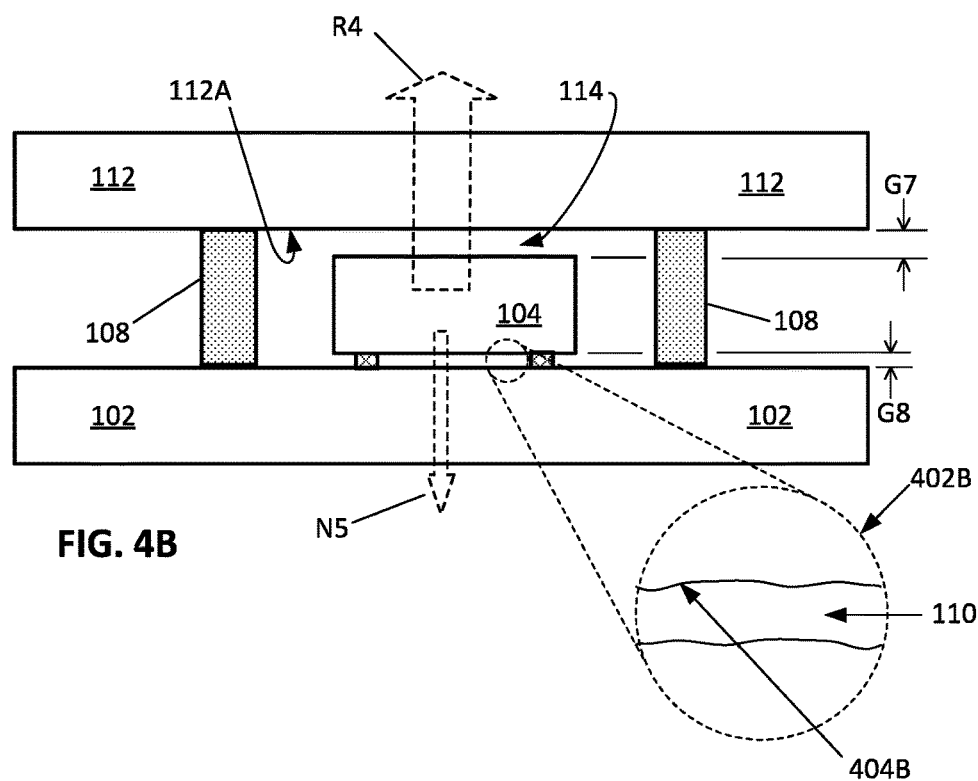

FIGS. 4A and 4B illustrate an example gap surface texture, and a providing of additional or alternative settings of path thermal resistance in accordance with one or more aspects of the present application. For convenience, the FIGS. 4A and 4B examples are illustrated and described as an adaptation of the FIG. 1 example tunable multi-path heat sink apparatus 100. It will be understood that this is not intended as a limitation on the scope of implementations and practices in accordance with this disclosure and its appended claims.

Referring again to FIG. 4A, the enlarged area 402A illustrates an example first gap surface texture, which includes a surface texture 404A on the lower surface 104A of the heat source 104. Referring again to FIG. 4B, the enlarged area 402B illustrates an example changed first gap 110 surface texture, including in this example a surface texture 404B on the lower surface 104A of the heat source 104. The example illustrated by FIGS. 4A and 4B assumes no appreciable change is made to surface texture (if any) on the upper surface 102A of the support 102. Persons of ordinary skill, though, upon reading this disclosure, can readily adapt the present description to an alternative implementation in which, in addition to or instead of the illustrated mode of changing first path interface surface texture from that visible in 402A to that visible in 402B, there is a change to surface texture on the upper surface 102A of the support 102.

Regarding the specific first gap surface textures visible in 402A and 402B, these can be application-specific. Persons of ordinary skill, though, having possession of the present disclosure can readily determine specific first gap surface textures for a given application, and therefore further detailed description is omitted.

Referring again to FIGS. 4A and 4B, the examples illustrate the change in the first gap 110 surface texture from that seen in area 402A to that seen in area 402B being configured to obtain increased first path thermal resistance, from a value represented by the FIG. 4A arrow N4 to a value represented by the smaller FIG. 4B arrow diameter N5. This is only an example and is not intended a limitation of practices according to this disclosure. For example, persons of ordinary skill, upon reading this disclosure, can readily adapt the present description to practice an alternative implementation in which, the change in the first gap 110 surface texture is configured to obtain the technical effect of decreasing the first path thermal resistance.

According to an implementation, it can be assumed there is no change, from FIG. 4A to FIG. 4B, in the first gap 110 spacing and no change in the second gap 114 spacing, e.g., the height of the heat source support spacers 106 and the heat sink support spacers 108 is unchanged. In an example implementation, though, in addition to the described change in the first gap 110 surface texture, changes in the first gap 110 spacing or second gap 114 spacing, or both, can be applied. Technical effects of this implementation can include, for example, additional degrees of freedom in adjusting the first and second path thermal resistances. Technical effects can also include obtaining a desired first path thermal resistance as a net or sum of the above-described effects of the first gap 110 spacing and first gap 110 surface texture. Further technical effects, and solutions provided by such implementations can include a statistical reduction in deviation of actual first path thermal resistance from intended first path thermal resistance arising, for example, from processing tolerances in practices of the above-described setting of the first gap 110 spacing.

Figure 5A:
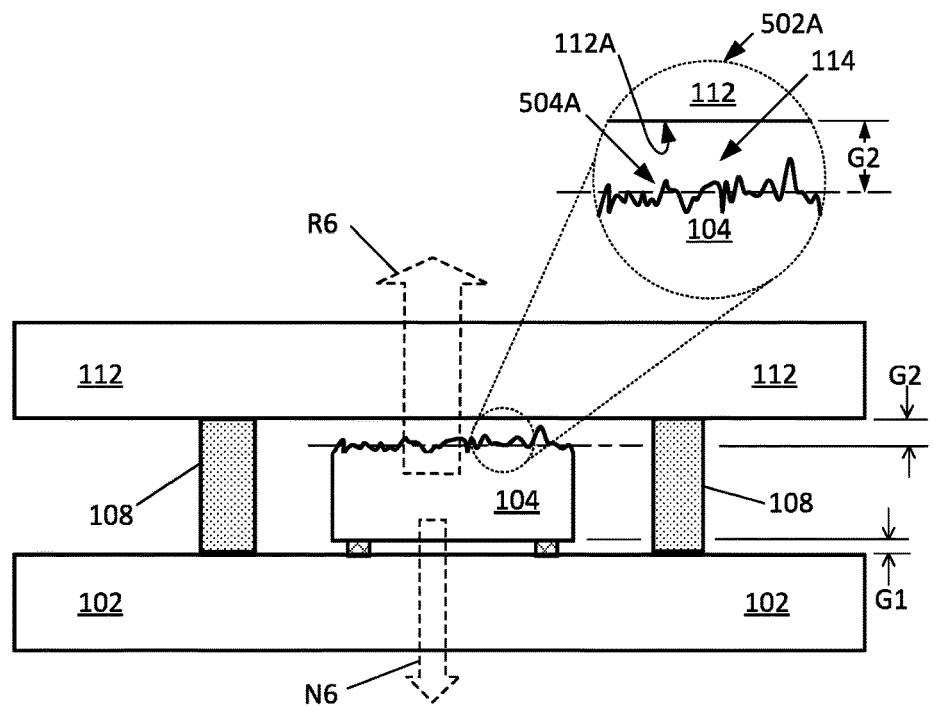
FIGS. 5A and 5B illustrate another example gap surface texture, and a providing of additional or alternative setting of thermal resistance in accordance with one or more aspects of the present application.
Figure 5B:
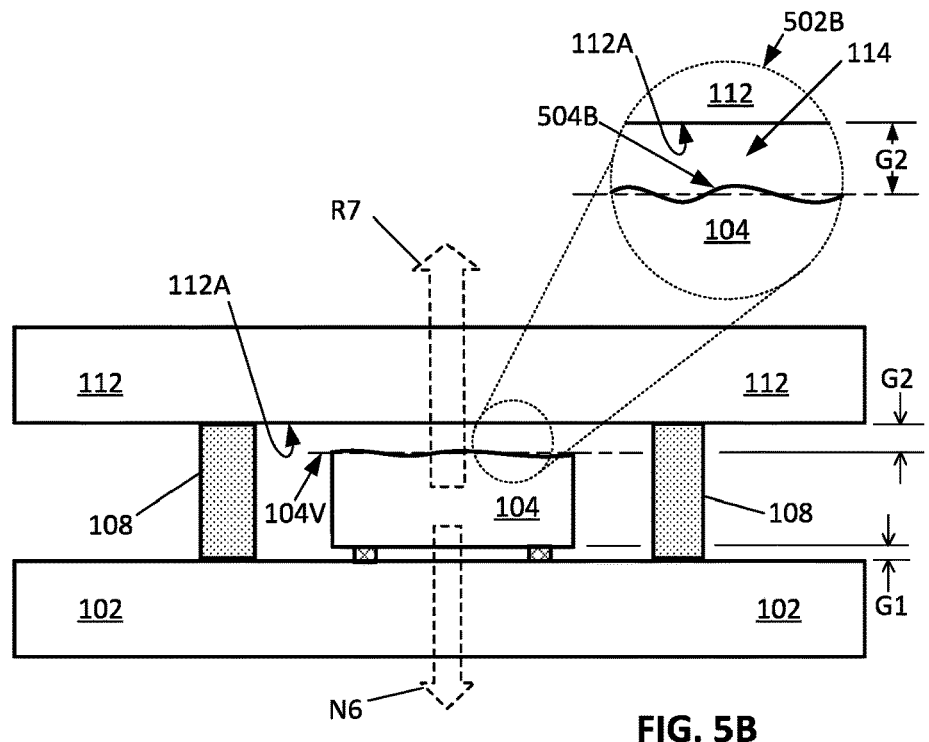

FIGS. 5A and 5B illustrate a gap surface texture, and a providing of additional or an alternative setting of thermal resistance in accordance with one or more aspects of the present application. For convenience, the FIGS. 5A and 5B examples are illustrated as an adaptation of the FIG. 1 example tunable multi-path heat sink apparatus 100. For example, FIGS. 5A and 5B assume an example first gap 110 spacing of G1 and second gap 114 of G2. It will be understood that this is not intended as a limitation on the scope of implementations and practices in accordance with this disclosure and its appended claims. FIG. 5A also assumes a first thermal path N6 and second thermal path R6 and these can be, for example, the same as the FIG. 1 first thermal path N1 and second thermal path R1.

Referring again to FIG. 5A, the enlarged area 502A shows an example second gap 114 surface texture, including a surface texture 504A on the upper surface 104B of the heat source 104. Referring again to FIG. 5B, the enlarged area 502B shows an example changed second gap 114 surface texture, including surface texture 504B on the upper surface 104A. The example shows the change in the second gap 114 surface texture being configured to obtain an increase in the second path thermal resistance, as represented by the diameter of the FIG. 5B second thermal path arrow R7 being narrower than the diameter of the FIG. 5A second thermal path arrow R6. Persons of ordinary skill, upon reading this disclosure, can readily adapt the present description—without undue experimentation—to practice an alternative implementation in which, the change in the second gap surface texture is configured to obtain the technical effect of decreasing the second path thermal resistance.

According to an implementation, it can be assumed there is no change, from FIG. 5A to FIG. 5B, in the first gap 110 spacing G1 and the second gap 114 spacing G2 as the height of the heat source support spacers 106 and the heat sink support spacers 108 are unchanged. In an implementation, in addition to the described change in second gap surface texture, any of the changes in the first gap 110 spacing or second gap 114 spacing, or both, can be applied. Technical effects of this implementation can include, for example, additional degrees of freedom in adjusting the first and second path thermal resistances. Technical effects can also include obtaining a desired second path thermal resistance being a net or sum of the above-described effects of the second gap 114 spacing and second gap surface texture. Further technical effects, and solutions provided by such implementations can include a statistical reduction in deviation of actual first path thermal resistance from intended first path thermal resistance arising, for example, from processing tolerances in practices of the above-described setting of the second gap 114 spacing.

The example illustrated by FIGS. 5A-5B assumes no appreciable change is made to surface texture (if any) on the lower surface 112A of the heat sink 112. Persons of ordinary skill, upon reading this disclosure, can readily adapt the present description to practice implementations in which, in addition to or instead of the illustrated mode of changing second gap surface textures shown by enlarged areas 502A and 502B, there is a change to surface texture on the lower surface 112A of the heat sink 112.

In another implementation, the heat source support spacers 106 can be omitted, or set to a height such that the support surface 102A of the support 102 and the heat source lower surface 104A make contact in the regions they face another. Aspects of this implementation can include forming a surface texture on, or applying a surface texture to the support surface 102A of the support 102 or the heat source lower surface 104A, or both. For purposes of description, this surface texture can be referred to as a "first thermal path interface surface texture."

Figure 6A:
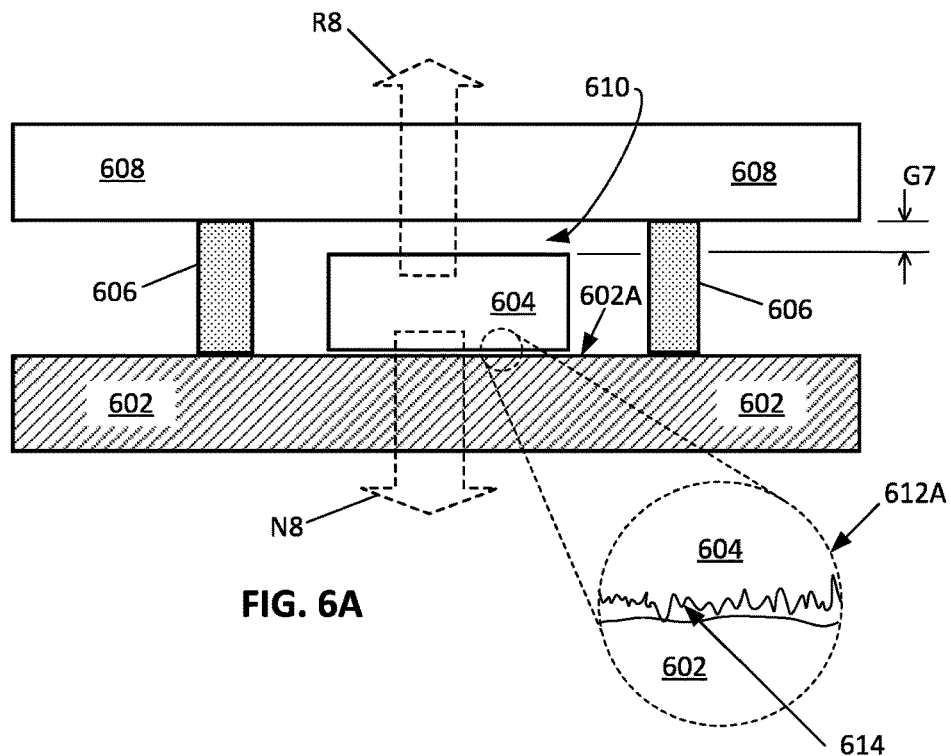
FIGS. 6A and 6B illustrate an example interface surface texture, and a providing additional or alternative setting of thermal resistance in accordance with one or more aspects of the present application.
Figure 6B:
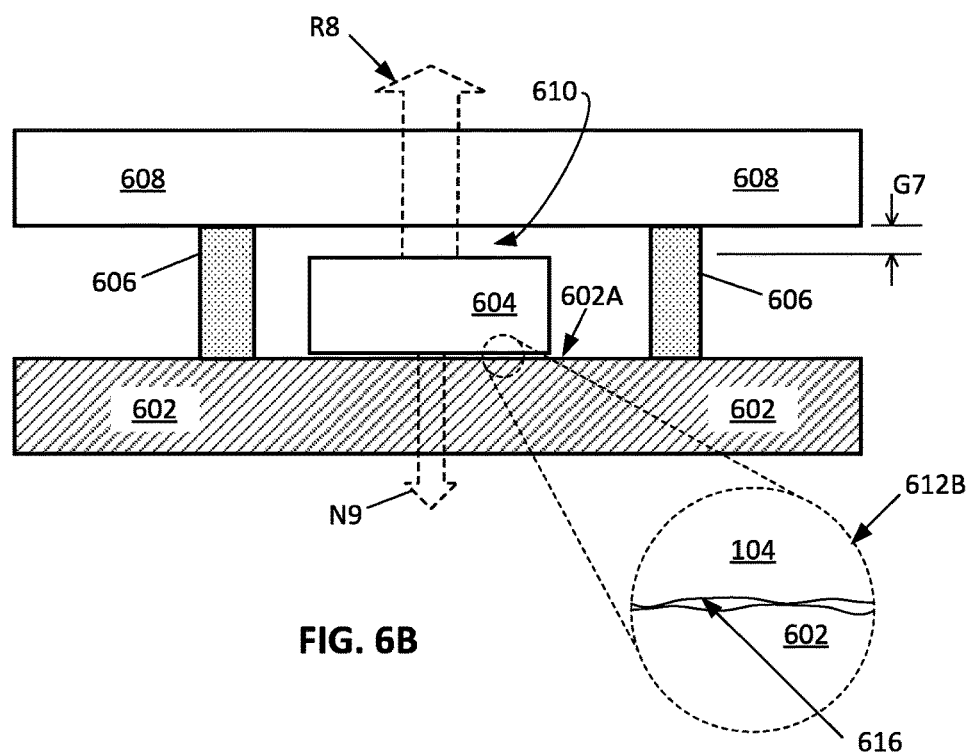

FIGS. 6A and 6B illustrate an example interface surface texture, and a providing of additional or alternative setting of thermal resistance in accordance with one or more aspects of the present application. Referring specifically to FIG. 6A, an implementation can include a support structure 602 supporting, on a support surface 602A, a heat source 604. Structure corresponding to the FIG. 1 heat source support spacers 106 can be omitted, or can be set to a height such that all, or some portion of the support surface 602A of the support structure 602 makes contact to some portion of the lower surface of the heat source 604. The implementation can include heat sink support spacers 606, arranged to support a heat sink 608. The heat sink support spacers 606 and the heat sink 608 can be configured to establish a gap 610 between a heat source upper surface 604A and a lower surface 608A of the heat sink 608.

Referring again to FIG. 6A, the support structure 602 can be, for example, a housing of a user device. In another implementation, for example where the heat source 604 is implemented as an IC package having a ball grid array (not visible in the figures) along its lower surface 604A, the structure 602 can be, for example, a printed circuit board.

Referring again to FIG. 6A, enlarged area 612A shows an example first surface texture 614 formed on or applied to the lower surface 604A of the heat source 604. The surface texture 614 can represent a contact surface on the support structure 602. For purposes of description, the above-described example surface textures described in reference to enlarged area 612A will be referred to as "first thermal path interface surface texture 612A." FIG. 6B enlarged area 612B shows an example changed gap first surface texture 616 formed on or applied to the lower surface 604A of the heat source 604. For purposes of description, the above-described example surface textures described in reference to enlarged area 612B will be referred to as "first thermal path interface surface texture 612B."

Referring again to FIGS. 6A and 6B, the example shows the change from first thermal path interface surface texture 612A to first thermal path interface surface texture 612B being configured to obtain the technical effect of increasing the first path thermal resistance. This is shown by the diameter of the FIG. 6A arrow N8 representing the first thermal path when it includes the first thermal path interface surface texture 612A being larger than the diameter of the FIG. 6B arrow N9 representing the second thermal path when it includes the first thermal path interface surface texture 612B. Persons of ordinary skill, upon reading this disclosure, can readily adapt the present description to practice an alternative implementation in which the change in the first thermal path interface surface texture is configured to obtain the technical effect of decreasing the first path thermal resistance.

Figure 7A:
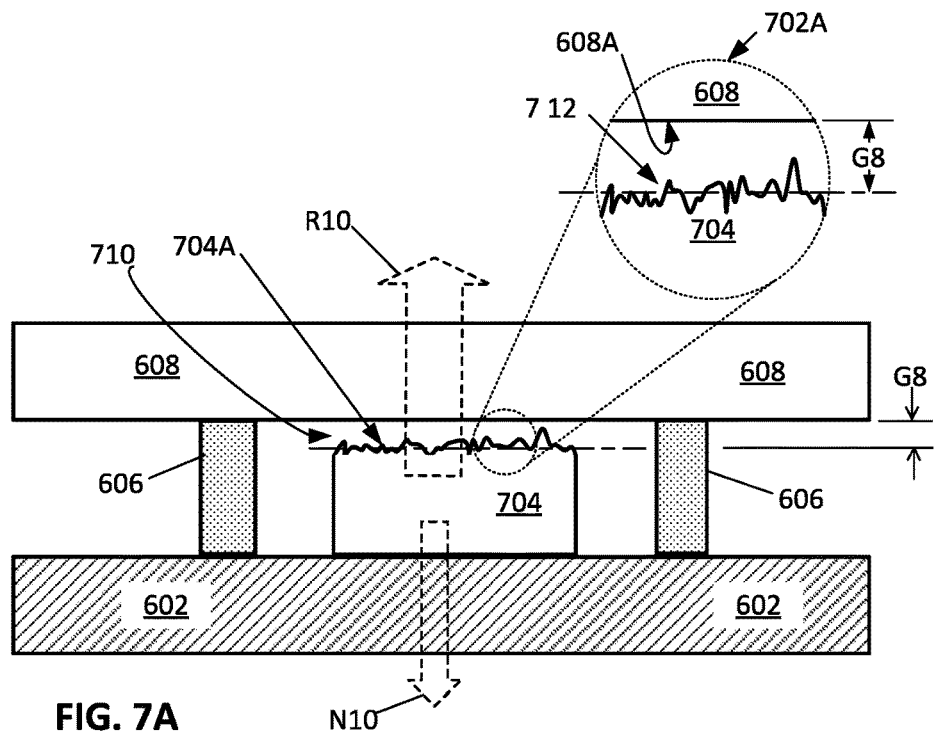
FIGS. 7A and 7B illustrate another example gap surface texture, alternative or additional to the interface surface texture illustrated in FIGS. 6A and 6B, in accordance with one or more aspects of the present application.
Figure 7B:
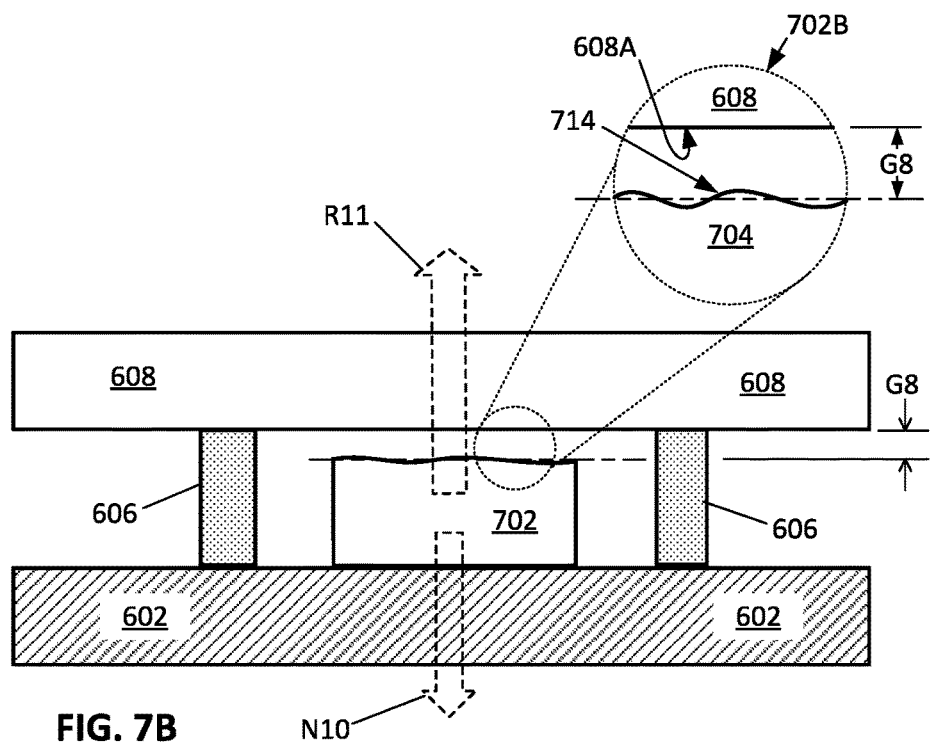

FIGS. 7A and 7B illustrate a surface texture implementation that can be an alternative or addition to the implementation illustrated in FIGS. 6A and 6B, in accordance with one or more aspects of the present application. For convenience, the FIGS. 6A and 6B examples are illustrated as an adaptation of the FIG. 6 example tunable multi-path heat sink apparatus. The differences are the heat source 604 being replaced with heat source 704, and the heat sink support spacers 606 and the heat sink 608 being configured to establish a gap 710 between a heat source upper surface 704A and the first or lower surface 608A of the heat sink 608.

Referring to FIG. 7A, enlarged area 702A shows, as one example configuration of surface textures applied to one or more of the surfaces that form the gap 710, a first surface texture 712 formed on or applied to the heat source upper surface 704A. Surface texture described in reference to enlarged area 702A will be referred to as "second thermal path gap texture 712." FIG. 7B enlarged area 702B shows, in place of the first surface texture 712 formed on the upper surface 704A of the heat source 704, a second surface texture 714. Surface textures illustrated by and described in reference to enlarged area 702B will be referred to as "second thermal path gap texture 714."

FIGS. 7A and 7B illustrate the difference between the second thermal path gap texture 712 and the second thermal path gap texture 714 being configured to increase the second path thermal resistance. This is shown by the diameter of the FIG. 7B arrow R11 representing the second thermal path being narrower than the diameter of the FIG. 7A arrow R10. Persons of ordinary skill, upon reading this disclosure, can readily adapt the present description to practice an alternative implementation in which the change in the second thermal path gap texture is configured to obtain a decrease in the second path thermal resistance.

Figure 8:
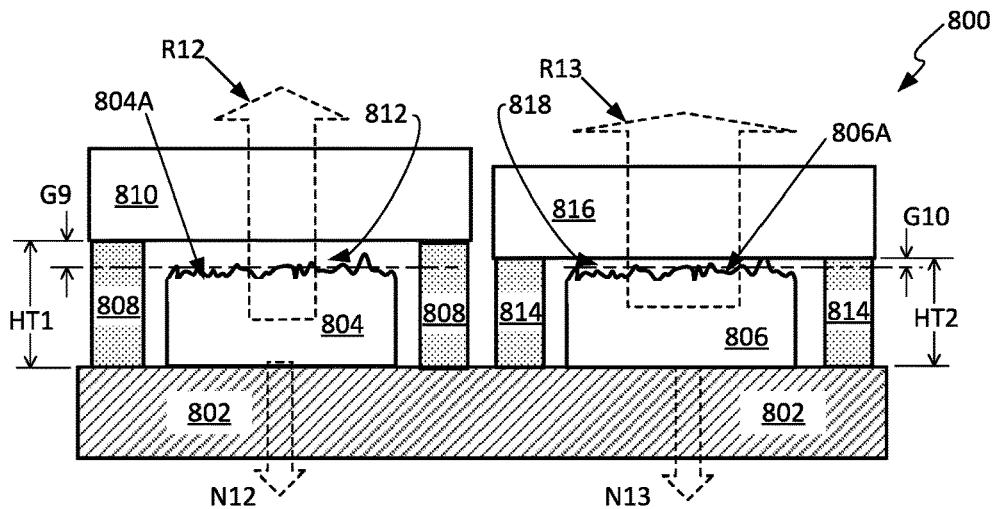
FIG. 8 illustrates a cross-sectional diagram an example multiple device, tunable multi-path heat sink apparatus according to one or more aspects of the present application.

FIG. 8 illustrates a cross-sectional diagram 800 of an example multiple device, tunable multi-path heat sink apparatus according to one or more aspects of the present application. For convenience, the FIG. 8 example is illustrated and described as an adaptation of the FIG. 1 example tunable multi-path heat sink apparatus 100. It will be understood that this is not intended as a limitation on the scope of implementations and practices in accordance with this disclosure and its appended claims.

Description of exemplary features and aspects will reference implementations as "tunable multi-path heat sink apparatus 800." The tunable multi-path heat sink apparatus 800 can include, for example, support structure 802 that is in accordance with the support structure 102 or the support structure 602. The support structure 802 can support a first heat source 804 and a second heat source 806, and can support a representative population of two first heat sink support spacers 808, each having a base or first end (visible but not separately labeled) that can be coupled, e.g., adhered, secured, bonded, connected to, formed upon, or attached, directly or indirectly, to the support structure 802, and each extending a height HT1, in an arrangement that can be similar to the heat sink support spacers 108 described above in reference to FIG. 1. A first heat sink 810 can be supported on the first heat sink support spacers 808, and can be configured such that a bottom surface (visible in cross-section in FIG. 8 but not separately labeled) of the first heat sink 810 is separated by a first heat sink gap 812 from an upper surface 804A of the first heat source 804. In an implementation, the first heat sink gap 812 can have a gap spacing "G9."

In an aspect, a representative population of two second heat sink support spacers 814, each having a base or first end (visible in cross-section but not separately labeled) that can be attached, e.g., adhered, bonded, formed upon, or otherwise attached, directly or indirectly, to the support structure 102, and each extending a height HT2, and a second heat sink 816 can be supported on the second heat sink support spacers 814. The second heat sink support spacers 814 and the second heat sink 816 can be configured such that a bottom surface (visible in cross-section FIG. 8 but not separately labeled) of the second heat sink 816 is separated by a second heat sink gap 818 from an upper surface 806A of the second heat source 806. In an implementation, the second heat sink gap 818 can have a gap spacing "G10."

The example configuration illustrated by FIG. 8 does not show a visible gap under the first heat source 804, i.e., between the bottom surface of that first heat source 804 and the underlying upper surface of the support structure 802. Similarly, FIG. 8 does not show a visible gap between the bottom surface of the second heat source 806 and the upper surface of the support structure 802 that underlies that bottom surface of the second heat source 806. A modification of FIG. 8 can insert spacers, such as items 106 illustrated in FIG. 1, to space the first heat source 804 a gap (not visible in FIG. 8) above the support structure 802. An example of such a modification can also replace the second heat sink support spacers 814 with spacers to space the second heat source 806 another gap (not visible in FIG. 8) above the support structure 802. In an implementation, the spacers under the second heat source 806 can be selected as shorter than those under the first heat source 804. This can make the gap between the second heat source 806 and the support structure 802 smaller than the gap under the first heat source 804. It will also space the upper surface 806A of the second heat source 806 from the underside of the second heat sink 816 by a gap larger than that between the upper surface 804A of the first heat source 804 and the underside of the first heat sink 810. In such an implementation, the gap between the bottom surface of the first heat source 804 and the support structure 802 can be referred to as a "first gap," the gap between the top surface 804A of the first heat source 804 and the underside of the first heat sink 810 can be referred to as a "second gap," the gap between the bottom surface of the second heat source 806 and the support structure 802 can be referred to as a "third gap," and the gap between the top surface 806A of the second heat source 806 and the underside of the second heat sink 816 can be referred to as a "fourth gap."

One implementation according to the above-described modification of the arrangement illustrated in FIG. 8 can install multiple instances of heat sources on support structures, using a common height of heat sink spacers, and using site-specific heights of their spacers. This can obtain a ready site-specific tuning of the thermal resistances between the heat sources' respective upper surfaces and the underside of their overlaying heat sinks, and corresponding tuning of the thermal resistances between the heat sources' respective bottom surfaces and their underlying regions of support structure.

Referring again to FIG. 8, the height HT2 of the second heat sink support spacers 814 is less than the height HT1 of the first heat sink support spacers 808 such that G10 is less than G9. Technical effects of G10 being less than G9 can be the thermal resistance of the first second heat sink 810 first transfer path R12 being substantially less than the thermal resistance of the second heat sink 816 first transfer path R13. This is visible in FIG. 8, by the arrow representing R13 having a substantially larger diameter than the arrow representing R12.

Figure 9A:
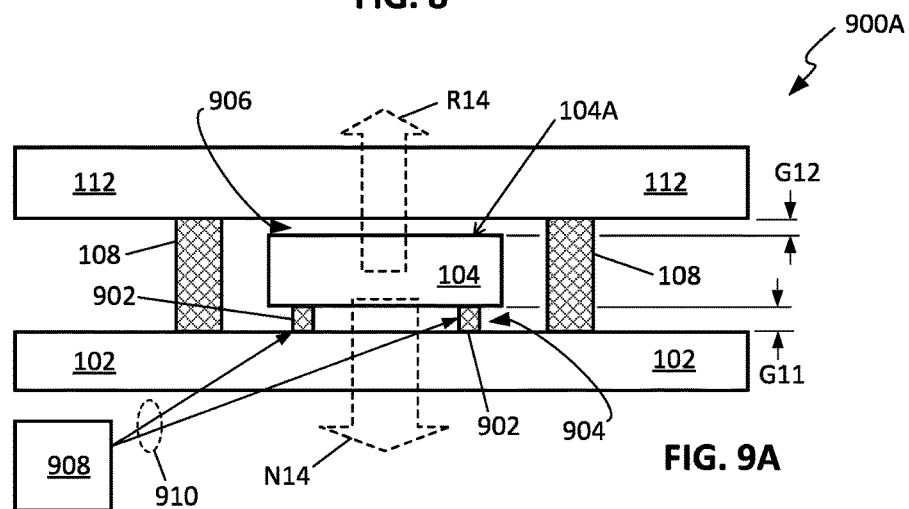
FIGS. 9A and 9B illustrate a cross-sectional diagram of one example piezoelectric dynamically tunable thermal resistance, multi-path heat sink apparatus, and an exemplary operation thereof according to one or more aspects of the present application.
Figure 9B:
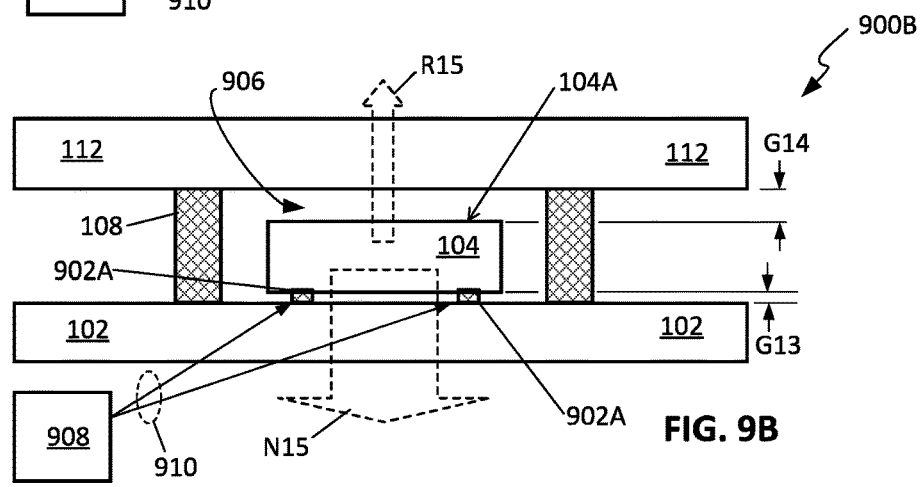

FIGS. 9A and 9B illustrate a cross-sectional diagrams 900A and 900B of one example piezoelectric dynamically tunable thermal resistance, multi-path heat sink apparatus, and an exemplary operation thereof, according to one or more aspects of the present application.

One example configuration of the dynamically tunable multi-path heat sink apparatus of FIGS. 9A and 9B can be an adaptation of the FIG. 1 tunable multi-path heat sink apparatus 100, constructed for example by replacing the heat source support spacers 106 with piezoelectric spacers 902. In an implementation either in place of or in combination with the implementation described in reference to FIGS. 9A and 9B, the FIG. 1 heat sink support spacers 108 can be replaced with piezoelectric heat sink spacers (not visible in the figures).

State 900A of the dynamically tunable multi-path heat sink apparatus of FIGS. 9A and 9B shows an arbitrary state of the piezoelectric spacers 902 that establishes a first gap 904 between the support surface (visible in FIGS. 9A and 9B, but not separately labeled) of the support structure 102 and the lower surface (visible in FIGS. 9A-9B but not separately labeled) of the heat source 104. FIG. 9A assumes a starting value of the gap spacing of the first gap 904 as G11. The state 900A of the piezoelectric spacers 902 also establishes, in combination with a thickness of the heat source 104 and height of the heat sink support spacers 108, the second gap 906 and its illustrated starting gap spacing of G12.

In an aspect, the piezoelectric spacers 902 can be controlled by a controller, such as the piezoelectric height adjustment controller 908. The piezoelectric height adjustment controller 908 can be implemented as a stand-alone, dedicated controller formed, for example, by a temperature sensor (not visible in FIGS. 9A-9B) and a look-up table (not visible in FIGS. 9A-9B) or equivalent that can generate control signals 910, for example, to compensate for given sensed thermal conditions. In an implementation, the piezoelectric height adjustment controller 908 can be configured to receive external control signals, for example, from a higher level processing resource (not visible in FIGS. 9A-9B).

State 900B illustrates an arbitrary example operation of the dynamically tunable multi-path heat sink apparatus of FIGS. 9A and 9B, which can be the piezoelectric height adjustment controller 908 generating control signals 910 at a value that causes the piezoelectric spacers 902 to extend in height by a distance labeled "Δ," and their respective states are represented in FIG. 9B as "902A." In an aspect the piezoelectric spacers 902 extending in height Δ to the 902A state causes the gap spacing of the first gap 904 to decrease Δ from G11 to G13 and causes the gap spacing of the second gap 906 to increase Δ from G12 to G14. A result can be a decrease in the first path thermal resistance and an increase in the second path thermal resistance. This is illustrated in FIGS. 9A-9B by the FIG. 9B arrow representing its first thermal path N15 having a substantially larger diameter than the FIG. 9A arrow representing its provided first thermal path N14, and the FIG. 9B arrow representing its second thermal path R15 having a substantially smaller diameter than the FIG. 9A arrow representing its provided second thermal path R14.

The piezoelectric height adjustment implementations described above in reference to FIGS. 9A and 9B assume visible, continuous gaps G11 and G13. An alternative implementation can include gaps that have discontinuity, in which one or more surface areas, for example, of the support 102 may be in physical contact with corresponding surface areas of the heat source 104 bottom surface, and one or more surface areas of the support 102 may not be in physical contact with corresponding surface areas of the heat source 104 bottom surface. In an example of such implementation, a gap, such as the first gap G13, can be an effective first gap, having a gap value that can be inversely proportional to a total area of the support 102 that is in physical contact with corresponding surface areas of the heat source 104 bottom surface, or is directly proportional to a total area of the support 102 that is not in physical contact with corresponding surface areas of the heat source 104 bottom surface, or both. In such an implementation, piezoelectric spacers can be configured such that control signals cause the piezoelectric spacers to urge the heat source 104 away from the support surface, in a direction that decreases a total area of the support surface that is in physical contact with corresponding surface areas of the heat source 104 bottom surface and correspondingly increases the effective first gap.

In another implementation, the FIG. 1 heat source support spacers 106 can be replaced with mechanically extendable and retractable heat source support spacers, such as screws or other threaded devices (not visible in the figures). In such implementations, methods can further include applying mechanical action, e.g., manually, that extends the heat source support spacers to urge the heat source 104 away from the support 102, in a direction that increases the gap spacing of the first gap and, concurrently, reduces the second gap.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows, and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein.

Relational terms such as first and second and the like may be used solely to distinguish one entity or action from another without necessarily requiring or implying any actual such relationship or order between such entities or actions. The terms "comprises," "comprising," and any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "a" or "an" does not, without further constraints, preclude the existence of additional identical elements in the process, method, article, or apparatus that comprises the element.

The Abstract of the Disclosure is provided to allow the reader to quickly identify the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that any claim requires more features than the claim expressly recites. Rather, as the following claims reflect, inventive subject matter lies in less than all features of a single disclosed example. Thus the following claims are hereby incorporated into the Detailed Description, with each claim standing on its own as a separately claimed subject matter.

What is claimed is:

1. A method comprising:
supporting, in an arrangement with a support member, a heat source that includes a heat source first surface and a heat source second surface that faces opposite the heat surface first surface;
providing a first thermal path from the heat source first surface through a first gap to the support member; and
providing a second thermal path from the heat source second surface through a second gap to a heat sink, including supporting the heat sink on a support surface of the support member in a configuration wherein an opposing face of the heat sink is spaced above and faces toward the support surface, and is spaced above the heat source second surface by the second gap,
wherein:
supporting the heat source on the support surface includes supporting the heat source on heat source support spacers located between the heat source first surface and the support surface,
supporting the heat sink on the support surface includes supporting the heat sink on heat sink support spacers that extend from the support surface to the heat sink,
providing the first thermal path provides a first thermal resistance that is based on a gap spacing of the first gap, and providing the second thermal path provides a second thermal resistance that is based on a gap spacing of the second gap,
the first gap includes discontinuity, in which one or more surface areas of the support surface are in physical contact with corresponding surface areas of the heat source first surface, and one or more surface areas of the support surface are not in physical contact with corresponding surface areas of the heat source first surface,
the first gap is an effective first gap, the effective first gap being inversely proportional to a total area of the support surface that is in physical contact with corresponding surface areas of the heat source first surface, or is directly proportional to a total area of the support surface that is not in physical contact with corresponding surface areas of the heat source first surface, or both, and
the heat source support spacers are piezoelectric spacers, wherein the method further comprises:
applying a control signal to the piezoelectric spacers to cause the piezoelectric spacers to urge the heat source away from the support surface, in a direction that decreases a total area of the support surface that is in physical contact with corresponding surface areas of the heat source first surface and correspondingly increases the effective first gap.

2. The method of claim 1, wherein:
the gap spacing of the second gap is formed by a spacing between the heat source second surface and the opposing face of the heat sink,
the second gap further includes a second gap surface texture, and the second gap surface texture includes a surface texture on the heat source second surface, or on the opposing face of the heat sink, or both, and
the second thermal resistance is further based on the second gap surface texture.

3. The method of claim 1, wherein:
the heat source is a first heat source,
the second thermal path is a first heat source second thermal path,
the first thermal resistance is a first heat source first thermal resistance,
the second thermal resistance is a first heat source second thermal resistance,
the heat source is supported at a first location on the support surface,
the heat sink is a first heat sink, and
the opposing face of the heat sink is a first heat sink face, wherein the method further comprises:
supporting a second heat source on the support surface, a second heat source first surface facing toward the support surface, and a second heat source second surface facing away from the support surface, in a configuration that provides a second heat source first thermal path from the second heat source first surface to the support surface; and
supporting a second heat sink on the support surface, wherein a second heat sink face is spaced above and faces toward the support surface, and is spaced above the second heat source second surface by a third gap, in a configuration providing a second heat source second thermal path from the second heat source second surface to the second heat sink.

4. The method of claim 3, wherein:
the second gap further includes a second gap surface texture that includes a surface texture on the first heat source second surface, or on the first heat sink face, or both, and the first heat source second thermal resistance is further based on the second gap surface texture, and
the third gap further includes a third gap surface texture that includes a surface texture on the second heat source second surface, or on the second heat sink face, or both, in a configuration wherein the second heat source second thermal resistance is further based on the third gap surface texture.

5. The method of claim 4, wherein:
a gap spacing of the third gap is identical to the gap spacing of the second gap,
the third gap surface texture is different from the second gap surface texture, and
the first heat source second thermal resistance and the second heat source second thermal resistance have a difference based on the difference between the third gap surface texture and the second gap surface texture.

6. A method comprising:
supporting, in an arrangement with a support member, a heat source that includes a heat source first surface and a heat source second surface that faces opposite the heat surface first surface;
providing a first thermal path from the heat source first surface through a first gap to the support member;
providing a second thermal path from the heat source second surface through a second gap to a heat sink; and
supporting the heat sink on a support surface of the support member in a configuration wherein a heat sink face is spaced above and faces toward the support surface, and is spaced above the heat source second surface by the second gap, wherein:

providing the first thermal path provides a first thermal resistance that is based on a gap spacing of the first gap, and providing the second thermal path provides a second thermal resistance that is based on a gap spacing of the second gap, supporting the heat source on the support surface includes supporting the heat source on heat source support spacers located between the heat source first surface and the support surface, supporting the heat sink on the support surface includes supporting the heat sink on heat sink support spacers that extend from the support surface to the heat sink, and the heat source support spacers are piezoelectric spacers, and the method further comprises:

applying a control signal to the piezoelectric spacers to cause the piezoelectric spacers to urge the heat source away from the support surface, in a direction that increases the gap spacing of the first gap and, concurrently, reduces the gap spacing of the second gap.

7. A method comprising:

supporting, in an arrangement with a support member, a heat source that includes a heat source first surface and a heat source second surface that faces opposite the heat surface first surface;

providing a first thermal path from the heat source first surface through a first gap to the support member; and providing a second thermal path from the heat source second surface through a second gap to a heat sink, wherein:

providing the first thermal path provides a first thermal resistance that is based on a gap spacing of the first gap, and providing the second thermal path provides a second thermal resistance that is based on a gap spacing of the second gap, supporting the heat source on the support surface includes supporting the heat source on heat source support spacers located between the heat source first surface and the support surface, supporting the heat sink on the support surface includes supporting the heat sink on heat sink support spacers that extend from the support surface to the heat sink, and the heat source support spacers are mechanically extendable and retractable, and the method further comprises:

applying a mechanical action to extend the heat source support spacers to urge the heat source away from the support surface, in a direction that increases the gap spacing of the first gap and, concurrently, reduces the gap spacing of the second gap.

8. An apparatus comprising:

a support member;

a heat source supported at a spacing relative to the support member;

a first support spacer, contacting a support surface of the support member, extending to a heat source first surface, and configured to space the heat source first surface a first gap spacing above the support surface; and a heat sink spaced from the support surface by second support spacers extending to a heat sink face over and spaced, by a second gap spacing, from a heat source second surface, wherein:

the first gap spacing is configured to enable a first thermal path, from the heat source first surface to the support member, the second gap spacing is configured to enable a second thermal path, from the heat source second surface to the heat sink, the first thermal path provides a first thermal resistance that is based on the first gap spacing, the second thermal path provides a second thermal resistance that is based on the second gap spacing, and the heat source first surface faces opposite the heat source second surface.

9. The apparatus of claim 8, wherein the heat sink is a first heat sink, and the support member includes a second heat sink.

10. The apparatus of claim 8, wherein:

the second gap spacing is formed by an area of the heat source second surface and an area of the heat sink face, the second gap spacing further includes a second gap surface texture, and the second gap surface texture includes a surface texture on the area of the heat source second surface, or on the heat sink face, or both, and the second thermal resistance is further based, at least in part, on the second gap surface texture.

11. The apparatus of claim 8, wherein:

the heat source is a first heat source, the heat sink is a first heat sink, the second thermal path is a first heat source second thermal path, the first thermal resistance is a first heat source first thermal resistance, the second thermal resistance is a first heat source second thermal resistance, the first support spacer is a first heat source support spacer, the heat sink face is a first heat sink face, and the second support spacers are first heat sink support spacers, wherein the apparatus further comprises:

a second heat source supported on the support surface;

a second heat source support spacer, contacting the support surface and configured to space a second heat source first surface a third gap spacing from the support surface; and a second heat sink, supported on the support surface by second heat sink support spacers to extend a second heat sink face over and spaced, by a fourth gap spacing, from a second heat source second surface, wherein:

the third gap spacing is configured to enable a second heat source first thermal path, from the second heat source first surface to the support member, the fourth gap spacing is configured to enable a second heat source second thermal path, from the second heat source second surface to the second heat sink, the second heat source first thermal path provides a second heat source first thermal resistance that is based on the third gap spacing, and the second heat source second thermal path provides a second heat source second thermal resistance that is based on the fourth gap spacing.

12. The apparatus of claim 11, wherein:
the second gap spacing further includes a second gap surface texture that includes a surface texture on the first heat source second surface, or on the first heat sink face, or both, and the first heat source second thermal resistance is further based on the second gap surface texture, and
the fourth gap spacing further includes a fourth gap surface texture that includes a surface texture on the second heat source second surface, or on the second heat sink face, or both, in a configuration wherein the second heat source second thermal resistance is further based on the fourth gap surface texture.

13. The apparatus of claim 12, wherein:
the second gap spacing is identical to the third gap spacing,
the second gap surface texture is different from the fourth gap surface texture, and
the first heat source second thermal resistance and the second heat source second thermal resistance have a difference based on the difference between the second gap surface texture and the fourth gap surface texture.

14. The apparatus of claim 8, wherein the heat source support spacer is a piezoelectric spacer and is configured to receive an external control signal and, in response, to urge the heat source away from the support surface.

15. The apparatus of claim 14, wherein the heat sink support spacer is a piezoelectric spacer and is configured to receive another external control signal and, in response, to urge the heat sink face away from the heat source second surface.

16. The apparatus of claim 8, wherein the heat source support spacer is a piezoelectric spacer and is configured to receive an external control signal and, in response, to urge the heat source in a direction that concurrently urges heat source first surface away from the support surface and the heat source second surface toward the heat sink face.

17. The apparatus of claim 8, wherein the heat sink support spacer is a piezoelectric spacer and is configured to receive an external control signal and, in response, to urge the heat sink face away from the heat source second surface.

* * * * *